(12) United States Patent
Zimmerman et al.

(10) Patent No.: US 11,814,744 B2
(45) Date of Patent: Nov. 14, 2023

(54) SUBSTRATE CLEANING COMPONENTS AND METHODS IN A PLATING SYSTEM

(71) Applicant: Applied Materials, Inc., Santa Clara, CA (US)

(72) Inventors: Nolan Zimmerman, Kalispell, MT (US); Gregory J. Wilson, Kalispell, MT (US); Andrew Anten, Whitefish, MT (US); Richard W. Plavidal, Kalispell, MT (US); Eric J. Bergman, Kalispell, MT (US); Tricia Youngbull, Kalispell, MT (US); Timothy Gale Stolt, Kalispell, MT (US); Sam Lee, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 291 days.

(21) Appl. No.: 16/370,265

(22) Filed: Mar. 29, 2019

(65) Prior Publication Data
US 2019/0301049 A1 Oct. 3, 2019

Related U.S. Application Data

(60) Provisional application No. 62/650,194, filed on Mar. 29, 2018.

(51) Int. Cl.
| | |
|---|---|
| *C25D 21/08* | (2006.01) |
| *C25D 5/48* | (2006.01) |
| *H01L 21/02* | (2006.01) |
| *C25D 7/12* | (2006.01) |

(Continued)

(52) U.S. Cl.
CPC .............. *C25D 21/08* (2013.01); *C25D 5/48* (2013.01); *C25D 7/12* (2013.01); *C25D 17/001* (2013.01);

(Continued)

(58) Field of Classification Search
None
See application file for complete search history.

(56) References Cited

U.S. PATENT DOCUMENTS

| | | | |
|---|---|---|---|
| 6,280,581 B1 * | 8/2001 | Cheng ...................... | C25D 5/08 204/224 R |
| 6,352,623 B1 * | 3/2002 | Volodarsky .............. | C25D 7/12 204/275.1 |

(Continued)

FOREIGN PATENT DOCUMENTS

| | | | | |
|---|---|---|---|---|
| JP | 2002060995 A | | 2/2002 | |
| KR | 101102328 B1 * | | 2/2012 | ............. C25D 17/00 |

(Continued)

OTHER PUBLICATIONS

Merriam-Webster definition of align retrieved Sep. 19, 2022 (Year: 2022).*

(Continued)

*Primary Examiner* — Louis J Rufo
(74) *Attorney, Agent, or Firm* — Kilpatrick Townsend & Stockton LLP

(57) ABSTRACT

Systems for cleaning electroplating system components may include an electroplating apparatus including a plating bath vessel. The electroplating apparatus may include a rinsing frame extending above the plating bath vessel. The rinsing frame may include a rim extending circumferentially about an upper surface of the plating bath vessel and defining a rinsing channel between the rim and the upper surface of the plating bath vessel. The electroplating apparatus may also include a rinsing assembly including a splash guard that is translatable from a recessed first position to a second position extending at least partially across an access to the plating bath vessel. The rinsing assembly may also include a fluid nozzle extending from the rinsing frame.

20 Claims, 11 Drawing Sheets

(51) Int. Cl.
*C25D 17/00* (2006.01)
*H01L 21/288* (2006.01)

(52) U.S. Cl.
CPC .... *H01L 21/02068* (2013.01); *H01L 21/2885* (2013.01)

(56) References Cited

U.S. PATENT DOCUMENTS

| | | |
|---|---|---|
| 2002/0121435 A1 | 9/2002 | Volodarsky et al. |
| 2002/0157960 A1 | 10/2002 | Dordi et al. |
| 2004/0058067 A1 | 3/2004 | Law et al. |
| 2009/0308415 A1* | 12/2009 | Sugiura .................. C25D 17/22 134/94.1 |
| 2013/0061875 A1 | 3/2013 | Woodruff |
| 2013/0292254 A1* | 11/2013 | Kumar ................. C25D 17/001 205/81 |
| 2017/0056934 A1 | 3/2017 | Wang et al. |

FOREIGN PATENT DOCUMENTS

| | | | |
|---|---|---|---|
| KR | 1020140017252 A * | 2/2014 | ........... C25D 17/001 |
| TW | 200302295 A | 8/2003 | |
| TW | 201402874 A | 1/2014 | |
| WO | 9802905 A2 | 1/1998 | |

OTHER PUBLICATIONS

Merriam-Webster definition of alignment retrieved Sep. 19, 2022 (Year: 2022).*

International Search Report and Written Opinion dated Aug. 2, 2019 in International Patent Application No. PCT/US2019/024919, all pages.

International Preliminary Report on Patentability dated Sep. 29, 2020 in International Patent Application No. PCT/US2019/024919, 8 pages.

* cited by examiner

SUBSTRATE CLEANING COMPONENTS AND METHODS IN A PLATING SYSTEM

CROSS-REFERENCE TO RELATED APPLICATIONS

This application claims the benefit of U.S. Provisional Application No. 62/650,194, filed Mar. 29, 2018, and which is hereby incorporated by reference in its entirety for all purposes.

TECHNICAL FIELD

The present technology relates to cleaning operations in semiconductor processing. More specifically, the present technology relates to systems and methods that perform in situ cleaning for electroplating systems.

BACKGROUND

Integrated circuits are made possible by processes which produce intricately patterned material layers on substrate surfaces. After formation, etching, and other processing on a substrate, metal or other conductive materials are often deposited or formed to provide the electrical connections between components. Because this metallization may be performed after many manufacturing operations, problems caused during the metallization may create expensive waste substrates or wafers.

During formation of metal materials on a wafer or substrate, a substrate may be submerged within a plating bath followed by metal formation on the substrate. The wafer may be subsequently raised and then rinsed at the chamber. The rinse may use water that may be sprayed across the surface of the substrate. Several issues may occur during this process. For example, water may fall into the plating bath causing dilution, which may cause rinse times to be shortened or be performed differently in an attempt to reduce dilution. Additionally during this rinse, plating solution from the bath may splash onto the wafer causing staining of the wafer from the chemicals. In some processing a substrate may be transferred from a first bath solution to a second bath solution to form additional metallization. Splashed bath materials from the first bath may contaminate the second bath when the substrate is delivered.

Thus, there is a need for improved systems and methods that can be used to produce high quality devices and structures while protecting both the substrate and the plating baths. These and other needs are addressed by the present technology.

SUMMARY

Systems for cleaning electroplating system components may include an electroplating apparatus including a plating bath vessel. The electroplating apparatus may include a rinsing frame extending above the plating bath vessel. The rinsing frame may include a rim extending circumferentially about an upper surface of the plating bath vessel and defining a rinsing channel between the rim and the upper surface of the plating bath vessel. The electroplating apparatus may also include a rinsing assembly including a splash guard that is translatable from a recessed first position to a second position extending at least partially across an access to the plating bath vessel. The rinsing assembly may also include a fluid nozzle extending from the rinsing frame.

In some embodiments the electroplating system may also include a head configured to support a substrate, and the head may be rotatable. The fluid nozzle may be indirectly coupled with the rinsing frame, and when the splash guard is in the second position, the fluid nozzle may be positioned within 10 mm from a center of the head. The head may be configured to rotate during rinsing at a velocity configured to sling fluid delivered from the fluid nozzle from a radial edge of a supported substrate into the rinsing channel. The head may include a seal about the head, and the electroplating apparatus may also include a seal clean nozzle coupled with the rim. The seal clean nozzle may be configured to eject a fluid tangentially across an exterior radial edge of the seal and into the rinsing channel. The splash guard may include a sloped or concave surface. The electroplating apparatus may also include a second fluid nozzle adjacent the first fluid nozzle and configured to deliver inert gas to a surface of a substrate. The fluid nozzle may be a first fluid nozzle positioned proximate a central axis through the rim of the rinsing frame, and the rinsing assembly may also include a second fluid nozzle positioned in line with and radially outward of the central axis from the first fluid nozzle.

The electroplating apparatus may also include an aspirator coupled with the splash guard. The splash guard may include a plurality of components coupled about the rim with a linkage, and when the splash guard is in the second position, the plurality of components may be configured to cover greater than 80% of the access to the plating bath vessel. The splash guard may include a floor extendable across the plating bath vessel. The floor may be characterized by a slope when extended across the plating bath vessel. The floor may include multiple retractable components. At least one of the multiple retractable components may include a flexible edge material configured to sweep residual fluid from an adjacent retractable component during a retraction operation of the floor. The rinsing frame may also include a track configured to guide the floor across the plating bath vessel.

The present technology also encompasses methods of rinsing a substrate at a semiconductor plating chamber. The methods may include raising a head from a plating bath, and the head may include a seal and a substrate coupled with the seal. The methods may include positioning a splash guard between the plating bath and the substrate. The methods may include rotating the head. The methods may also include flowing a rinse fluid across the substrate from a fluid nozzle. The rotating head may sling the rinse fluid from a radial edge of the substrate to a collection channel defined by a rinse frame extending above and radially outward of the plating bath. A seal clean nozzle may be coupled with the rinse frame, and the method may also include flowing the rinse fluid from the seal clean nozzle. The seal clean nozzle may be positioned to direct the rinse fluid tangentially across the seal and into the collection channel. The fluid nozzle may be coupled with the splash guard, and the fluid nozzle may be positioned proximate a central location below the substrate during the positioning of the splash guard. A gas nozzle may be coupled adjacent the fluid nozzle, and the method may also include flowing an inert gas across the substrate to dry residual rinse fluid from a surface of the substrate.

The present technology also encompasses electroplating apparatus. The apparatus may include a plating bath vessel. The apparatus may include a head comprising a seal configured to support a substrate. The apparatus may include a rinsing frame extending above the plating bath vessel. The rinsing frame may include a rim extending circumferentially about an upper surface of the plating bath vessel and defining a rinsing channel between the rim and the upper surface of the plating bath vessel. The rinsing frame may also include a housing extending laterally from the rim. The apparatus may also include a rinsing assembly. The rinsing assembly may also include a splash guard translatable from a first position recessed within the housing to a second position extending at least partially across the plating bath vessel and located between the plating bath vessel and the head. The rinsing assembly may also include a fluid nozzle extending from the housing along the splash guard. In some embodiments, the splash guard may be characterized by a sloped or curved profile extending from an edge towards a central location proximate the fluid nozzle. The rinsing assembly may also include a drying nozzle positioned adjacent the fluid nozzle and configured to deliver a gas to dry a substrate subsequent rinsing. The rinsing assembly may also include an aspirator positioned proximate the fluid nozzle and configured to retrieve fluid disposed on the splash guard.

Such technology may provide numerous benefits over conventional technology. For example, the present technology may limit electroplating bath splashing on the substrate. Additionally, the systems may limit or reduce bath dilution from rinse solution, which may allow extended cleaning processes, as well as improved cleaning techniques. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Figure 1:
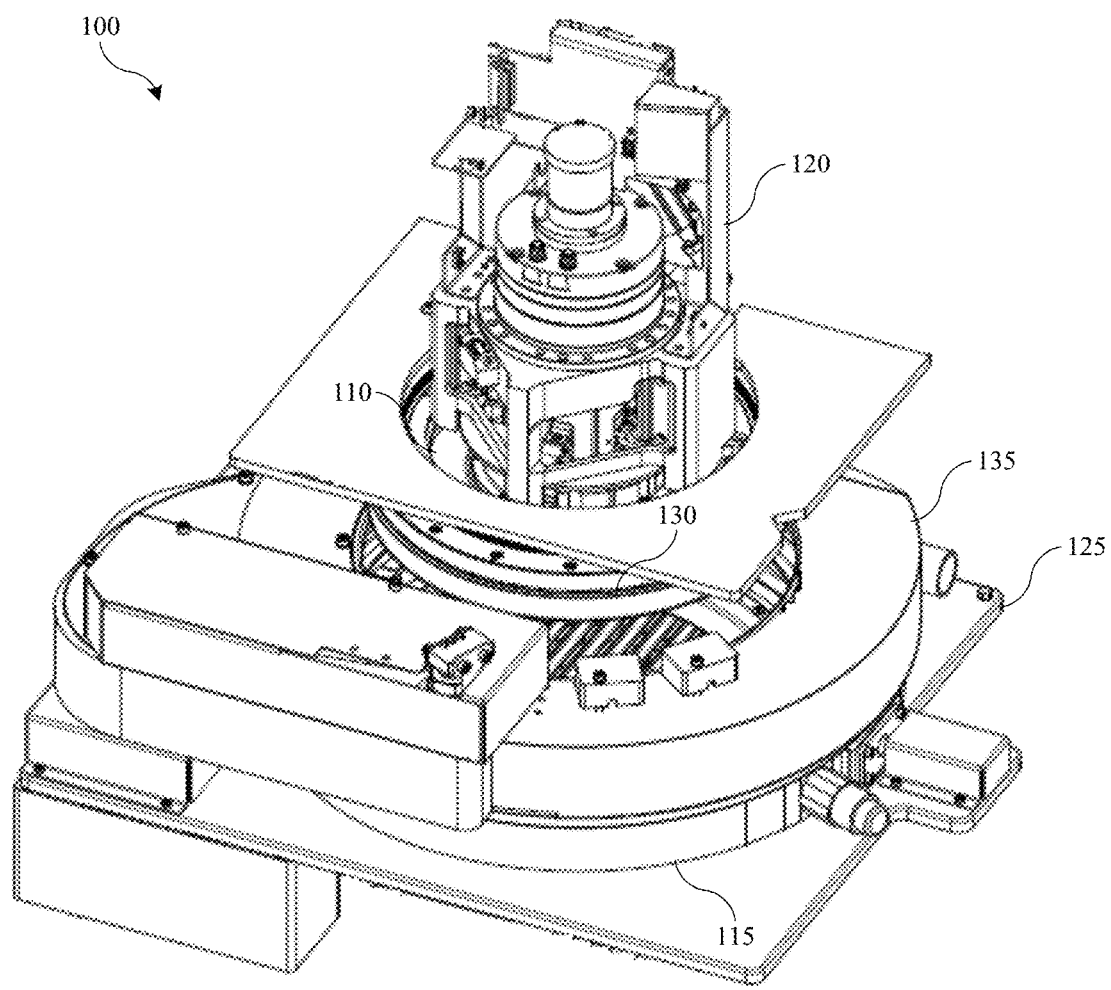
FIG. 1 shows a schematic perspective view of a chamber on which cleaning technology may be coupled according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Various operations in semiconductor manufacturing and processing are performed to produce vast arrays of features across a substrate. As layers of semiconductors are formed, vias, trenches, and other pathways are produced within the structure. These features may then be filled with a conductive or metal material that allows electricity to conduct through the device from layer to layer.

Electroplating operations may be performed to provide conductive material into vias and other features on a substrate. Electroplating utilizes an electrolyte bath containing ions of the conductive material to electrochemically deposit the conductive material onto the substrate and into the features defined on the substrate. The substrate on which metal is being plated operates as the cathode. An electrical contact, such as a ring or pins, may allow the current to flow through the system. During electroplating, a substrate may be clamped to a head and submerged in the electroplating bath to form the metallization. In systems as described below, the substrate may also be chucked within a seal that may be coupled with the head during processing. When the substrate is raised after plating, it may be rinsed with water, such as deionized water, prior to being sent to another plating chamber or some other processing location. Rinsing a wafer and head seal within a plating chamber before moving to another plating chamber is preferred over moving the components to a stand-alone rinse chamber because of the reduced system footprint, operational cost, and number of robot movements required. However, as noted above, several issues may occur during this rinsing operation.

Conventional technologies may rinse the substrate directly over the bath from a nozzle that ejects rinsing fluid from a side of the chamber towards a center of the substrate. The substrate may be rotated at some speed during the rinsing, which may draw the water across the substrate and sling the water into a catch located at an exterior of the chamber. During the delivery, water may fall into the electrolyte bath, which may splash solution up onto the wafer. This may cause staining of the substrate, or may bring electrolyte to a subsequent bath having a different solution, which may contaminate the second bath. Additionally, plating chambers may accommodate multiple substrate sizes, and thus, for example, a 200 mm semiconductor wafer and a 300 mm semiconductor wafer may be processed in the same chamber. During the sling operation, the smaller diameter 200 mm wafer may not fully deliver rinse fluid into the catch, which may cause it to be delivered into the electrolyte bath. This may cause more substantial dilution of the bath, which may limit the amount of rinsing that may be performed. Additionally, when water is ejected on to the wafer from an exterior nozzle, the velocity of the spray may cause the water to skim across the surface of the wafer and limit the amount of cleaning of the wafer surface.

The present technology overcomes these issues by incorporating a cleaning system that may perform an in situ clean of the wafer, while protecting the wafer and the electrolyte bath. The system may include a splash guard of various designs that protect the wafer from bath splashing, as well as may limit the amount of rinse solution that may contact the bath. Additionally, some embodiments of the present technology may utilize a rinse nozzle that is connected with the splash guard to deliver rinse solution at a more central location. By utilizing cleaning systems according to the present technology, cleaning may be performed more easily, and more efficiently, and splashing may be limited or prevented. An improved rinsing within a chamber, while avoiding dilution and staining, is also a valuable advancement for processing wafers. Such a chamber gives flexibility of rinse recipe steps, wafer positions, and flow rates to provide improved results without the concerns of dilution and staining. After describing an exemplary chamber on which embodiments of the present technology may be coupled, the remaining disclosure will discuss aspects of the systems and processes of the present technology.

An additional issue that may occur is plating on the seal that may create residual conductive material that can affect subsequent operations. The present technology may also utilize additional operations to perform seal clean operations to reduce buildup of plating materials on the seal.

FIG. 1 shows a schematic perspective view of an electroplating system 100 for which methods and cleaning systems may be utilized and practiced according to embodiments of the present technology. Electroplating system 100 illustrates an exemplary electroplating system including a system head 110 and a bowl 115. During electroplating operations, a wafer may be clamped to the system head 110, inverted, and extended into bowl 115 to perform an electroplating operation. Electroplating system 100 may include a head lifter 120, which may be configured to both raise and rotate the head 115, or otherwise position the head within the system including tilting operations. The head and bowl may be attached to a deck plate 125 or other structure that may be part of a larger system incorporating multiple electroplating systems 100, and which may share electrolyte and other materials. A rotor may allow a substrate clamped to the head to be rotated within the bowl, or outside the bowl in different operations. The rotor may include a contact ring, which may provide the conductive contact with the substrate. A seal 130 discussed further below may be connected with the head. Seal 130 may include a chucked wafer to be processed. FIG. 1 illustrates an electroplating chamber that may include components to be cleaned directly on the platform. It is to be understood that other configurations are possible, including platforms on which the head is moved to an additional module and seal or other component cleaning is performed. Additionally, one or more components, such as seal 130 may be removed from a respective chamber and placed in a maintenance system or cleaning system for cleaning. Any number of other operations may be performed that provide or expose a component for cleaning. An exemplary in situ rinse system 135 is also illustrated with the system 100, and will be described in further detail below.

Figure 2:
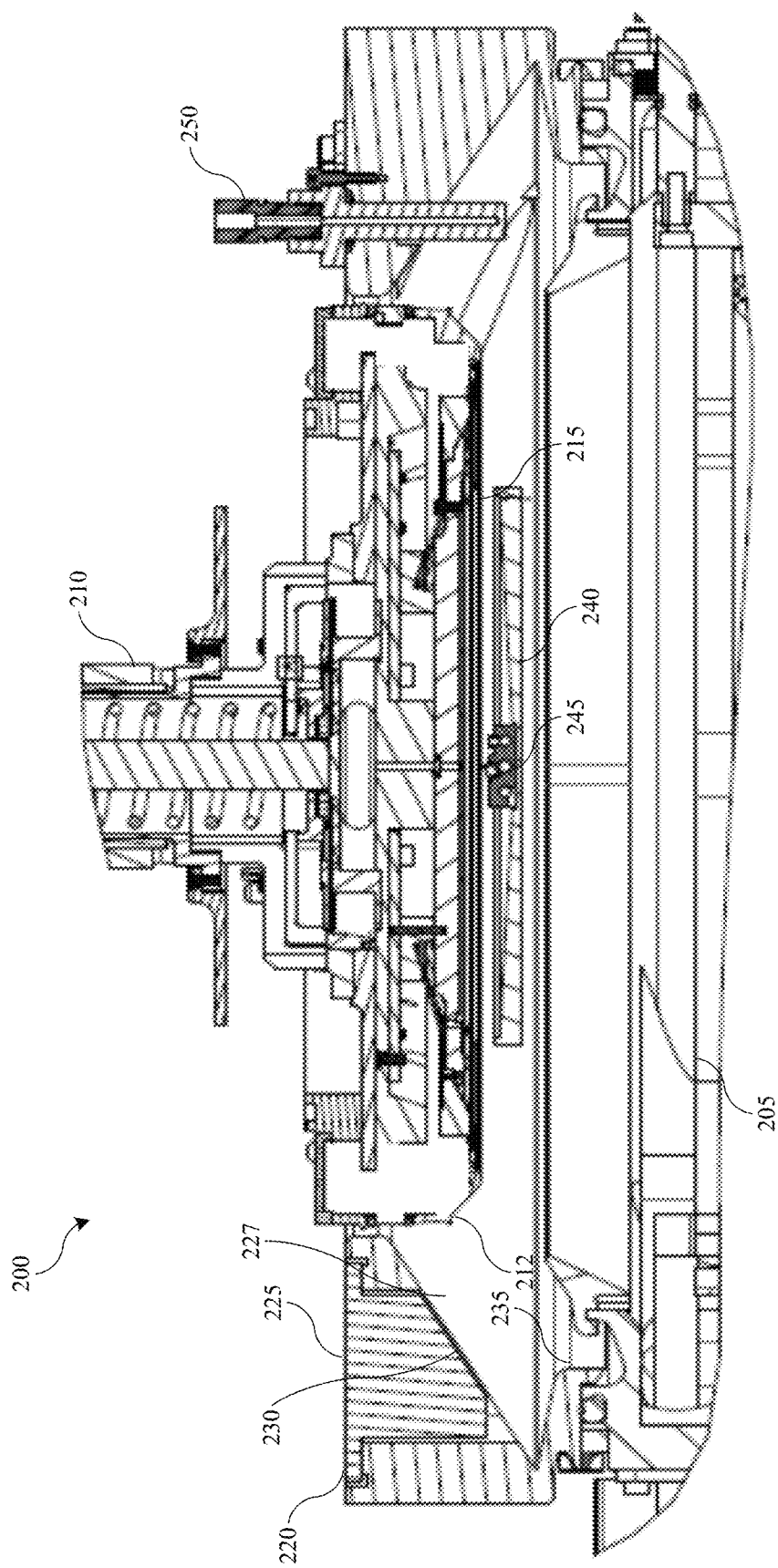
FIG. 2 shows a partial cross-sectional view of a chamber including aspects of a rinsing assembly according to some embodiments of the present technology.

Turning to FIG. 2 is shown a partial cross-sectional view of a chamber including aspects of an electroplating apparatus 200 according to some embodiments of the present technology. The electroplating apparatus 200 may be incorporated with an electroplating system, including system 100 described above. As illustrated in FIG. 2, a plating bath 205 of an electroplating system is shown along with a head 210 having a substrate 215 coupled with the head. The substrate may be coupled with a seal 212 incorporated on the head in some embodiments. A rinsing frame 220 may be coupled above the plating bath vessel 205, and may be configured to receive the head into the vessel during plating. Rinsing frame 220 may include a rim 225 extending circumferentially about an upper surface of the plating bath vessel 205. A rinsing channel 227 may be defined between the rim 225 and an upper surface of the plating bath vessel 205. For example, rim 225 may be include interior sidewalls 230 characterized by a sloping profile. As described above, rinse fluid slung off a substrate may contact the sidewalls 230, and may be received in a plenum 235 extending about the rim for collection of the rinse fluid from the electroplating apparatus 200.

Electroplating apparatus 200 may additionally include one or more cleaning components in some embodiments. The components may include one or more nozzles used to deliver fluids to or towards the substrate 215 or the head 210. FIG. 2 illustrates one of a variety of embodiments in which improved rinse assemblies may be used to protect the bath and substrate during rinsing operations. As illustrated, a splash guard 240 is positioned between the wafer 215 and the plating bath vessel 205, and may be associated with a fluid nozzle 245, which may deliver a rinse fluid to substrate 215 in embodiments. Unlike some conventional technologies, some embodiments of the present technology may include fluid nozzle 245 along the splash guard 240 to a central location near a center of the wafer. The nozzle 245 may also be positioned a short distance from the substrate 215, which may provide a number of benefits discussed below. For example, splash guard 240 and/or nozzle 245 may be positioned less than 2 cm from the substrate surface, and may be positioned less than or about 1 cm from the substrate surface, less than or about 9 mm from the substrate surface, less than or about 8 mm from the substrate surface, less than or about 7 mm from the substrate surface, less than or about 6 mm from the substrate surface, less than or about 5 mm from the substrate surface, less than or about 4 mm from the substrate surface, less than or about 3 mm from the substrate surface, or less. Electroplating apparatus 200 may also include additional nozzles with nozzle 245 as will be explained further below. A side clean nozzle 250 may extend through the rim 225 of the rinsing frame 220 in some embodiments and be directed to rinse seal 212, along with aspects of substrate 215.

By delivering rinse fluid, such as deionized water, directly up from below the wafer, or at a slight angle as illustrated in some embodiments, the velocity of the delivery may be reduced, and rotation of the head may be used to draw the rinse fluid radially outward along the substrate. The reduced velocity of delivery may limit upward splashing of fluid back down, and may ensure an improved central delivery of fluid. For example, some side nozzles that eject fluid at an angle towards the substrate may not directly contact a central region of the substrate. For example, even minor height discrepancies of the head may affect where fluid contacts the substrate. If the contact point is radially outward of a central position, fluid drawn outward across the substrate may fail to rinse an interior portion of the substrate and staining or contamination as previously discussed may occur. The present technology may more readily direct fluid to the surface of the substrate when a central delivery is utilized, and thus ensure more complete rinsing of a substrate. This may provide increased flexibility, which may also allow substrate and seal rinsing to occur simultaneously as further described below. This may reduce processing time, increasing wafer throughput with some embodiments of the present technology, and also increasing reliability of rinse operations. Additionally, by utilizing a reduced velocity, rinse fluid may be controlled by the inertial action of the rotating head, instead of with a combination with the contact angle of incidence, such as with a side ejected stream, which may affect the amount of water that may simply skim across the surface of the substrate, or extend over an underlying fluid layer without fully rinsing the substrate.

Figure 3A:
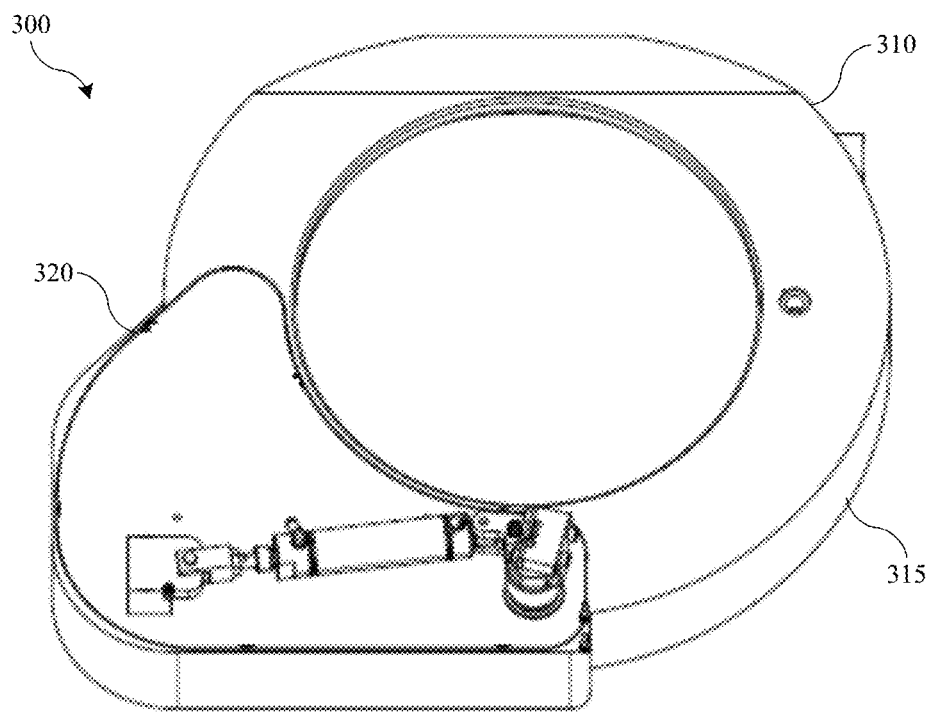
FIGS. 3A-3B show schematic top perspective views of a rinsing assembly according to some embodiments of the present technology.
Figure 3B:
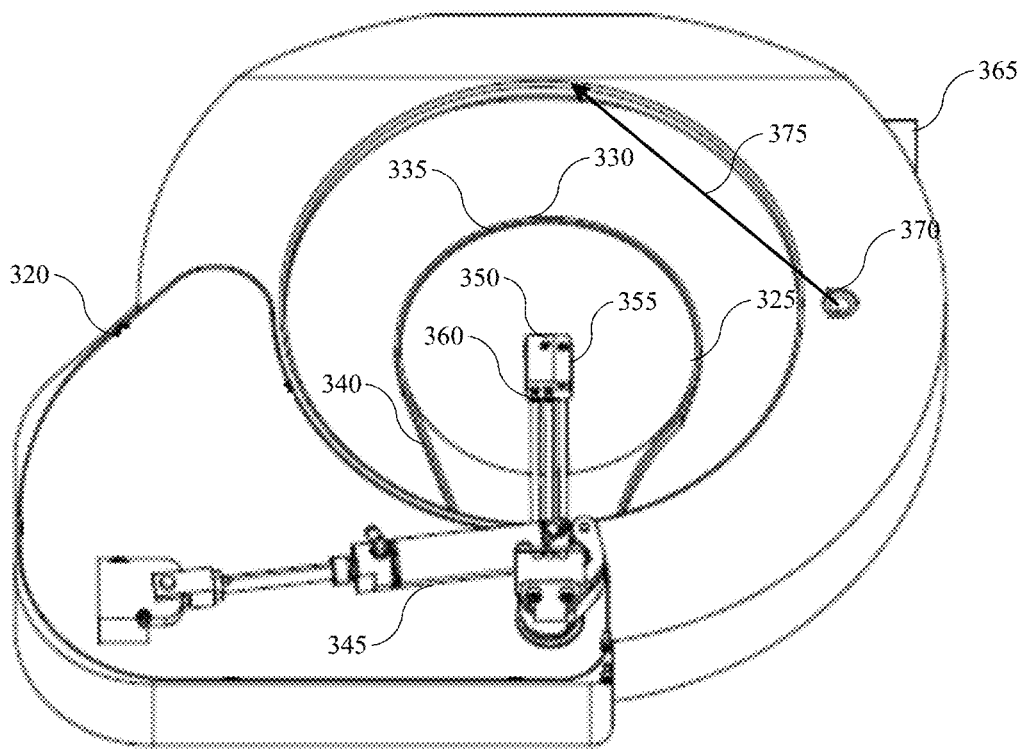

FIGS. 3A-3B show schematic top perspective views of a rinsing apparatus 300 according to some embodiments of the present technology. Rinsing apparatus 300 may include any of the components described above in FIG. 2, and may be incorporated with a plating system, such as system 100 described above. The rinsing apparatus may include a frame 310 extending above a plating bath vessel as discussed above. The frame may include a rim 315 characterized by an annular or substantially annular profile that may accommodate a head for delivery of a substrate through the frame 310 for plating operations. The rim 315 may at least partially define a channel for receiving rinse fluid as described above. Drain 365 may be located at an exterior edge of rim 315 for recovering rinse fluid collected in the channel. Frame 310 may also include a housing 320 extending laterally from rim 315. The housing 320 may extend along a portion of the rim as illustrated and may extend laterally outward of the rim, or may extend along a greater or lesser region about the frame for housing different rinsing assembly components according to embodiments of the present technology.

As shown in FIG. 3B, a rinsing assembly 325 may be recessed within housing 320 during plating operations. For example, rinsing assembly 325 may be translatable to a number of positions between a recessed first position within housing 320, as illustrated in FIG. 3A, and a second operational position as illustrated in FIG. 3B. The second operational position may locate components of the rinsing assembly between the plating bath vessel, and the substrate for rinsing.

Rinsing assembly 325 may include a splash guard 330 that is fully translatable to any position between a first position fully recessed within housing 320, or fully outside of an access defined by rim 315 to accommodate plating operations, and a second position located within the access. Splash guard 330 may be characterized by a number of profiles and shapes as will be discussed in detail below, and may include a platform 335 and a pivot arm 340. Pivot arm 340 may be rotatably coupled with a linkage allowing the pivot arm to be rotated from the recessed position to the operational positions. An air cylinder 345 or piston may be coupled with a solenoid to drive the linkage and position the pivot arm 340 and platform 335. The platform and pivot arm may be a single piece design including a common profile or material, although in some embodiments the platform 335 may be shaped to retrieve rinse fluid that falls onto the platform. For example, platform 335 may include a concave shape or other sloped profile on an upper surface configured to face a substrate. The profile may allow rinse fluid that falls on the platform to flow or fall to a central location, although in some embodiments the fluid may be directed to an exterior location.

For example, platform 335 may be sized to accommodate a particular housing, as will be discussed below, and may not be limited by the housing size illustrated. For example, housing 320 may extend laterally further in multiple directions to accommodate a larger platform 335. The platform may be sized to provide partial up to complete coverage of the access size through rim 315. For example, the platform 335 may be sized to accommodate configurations where rinse fluid slung from a wafer edge poses little risk of flowing into the plating bath vessel, or where splash from initial contact of rinse fluid with a central portion of the substrate poses a greater concern, or where spacing on a system limits the size of a platform that may be recessed within housing 320. As noted, a variety of splash guards encompassed by the present technology will be described in further detail below.

A fluid nozzle 350 may also be incorporated with rinsing assembly 325, and may or may not be coupled with splash guard 330, and may be directly or indirectly coupled with frame 310. For example, where the splash guard fully accommodates coverage of the plating bath vessel, the fluid nozzle may be positioned at an exterior location for improved access and to limit complexity of design. Hence, the coupling of the nozzle may be a direct coupling with the rinsing frame. In other embodiments, as illustrated, fluid nozzle 350 may be indirectly coupled with the frame, and may be connected with tubing extending from a coupling through housing 320, and extending along pivot arm 340 and platform 335 to a central location providing access to a central position of the substrate for rinsing. When nozzle 350 is coupled with platform 335, fluid delivery may occur at any time during platform positioning. For example, in some embodiments fluid delivery may occur subsequent central positioning of the platform. Fluid delivery may also occur during rotation. For example, as rotation begins, or as fluid nozzle 350 clears housing 320, or at any other time, rinse fluid may be delivered to begin rinsing a seal to which the substrate is chucked, as well as to begin rinsing the substrate. The head may also be rotated during this rinsing operation, and continue along with rinsing after the platform and nozzle have been centrally located. These operations may also occur while platform 335 is being retracted after a central rinsing operation. The flexibility afforded by platform 335 and nozzle 350 may provide any variety of rinsing operations encompassed by the present technology for which bath dilution may not be a concern due to fluid collection at the platform 335, or through delivery into an external channel. In some embodiments, a plurality of fluid nozzles 350 may be positioned along the associated fluid tubing to allow multiple rinsing positions, such as which may afford substrate rinsing and seal rinsing simultaneously from below the substrate. For example, a first fluid nozzle may be positioned proximate a central axis through the rim 315, while a second fluid nozzle may be positioned at an exterior edge of platform 335 or pivot arm 340. The two or more nozzles may be radially in line with one another, such as along similar tubing, or may have separate fluid delivery lines coupled with the nozzles to provide selectable delivery of rinse fluid in embodiments.

Additional fluid nozzle 355 may be co-located with fluid nozzle 350, and may afford delivery of a gas, such as an inert gas, to dry a substrate subsequent rinsing. For example, fluid nozzle 355 may include similar tubing adjacent that for fluid nozzle 350, and may allow nitrogen or some other gas to be flowed against the substrate. The nozzle may be directed to provide flow across the surface of the substrate, or in some embodiments additional translation of splash guard 330 along an xy grid may provide additional drying capabilities. For example, piston 345 and associated linkages may allow the pivot arm to be extended or further rotated. Additionally, because the substrate may be rotated on the system head, while splash guard 330 is translating between the second position and the first position, a stream of gas from fluid nozzle 355 may dry the substrate across the radial surface. An access 360 to an aspirator may also be positioned proximate first fluid nozzle 350, which may recover rinse fluid collected in platform 335. For example, the sloped or curved surface of platform 335 may draw rinse fluid towards a central location where an aspirator may draw the fluid from access 360, such as seated below fluid nozzle 350, for example.

Additionally illustrated in FIG. 3 is access 370 through which a seal clean nozzle may be disposed, such as nozzle 250 described above. A seal clean nozzle may be positioned within the access 370, and may be angled to direct rinse fluid tangentially along a seal with which a substrate is clamped, such as along trajectory 375 illustrated. Because the head may be at least partially submerged within the plating vessel bath, plating fluid may be rinsed from outer portions of the head, which may not be accessible to fluid delivered from fluid nozzle 350. The stream may be directed tangentially across the head to limit splashing or redirect fluid from flowing into the plating bath vessel. Instead, the fluid may be directed into the rinsing channel described above due to the tangential delivery.

FIGS. 4-14 will now be described to illustrate additional rinsing assemblies and splash guards encompassed by the present technology. Any of the features of any figure may be incorporated within system 100, electroplating apparatus 200, or rinsing apparatus 300. It is to be understood that the figures illustrate additional examples that are not limited, but explain variations on many designs and configurations similarly encompassed by the present technology. Some of the rinsing assemblies may illustrate only the splash guard or also a fluid nozzle, but it is to be understood that any nozzle configuration discussed throughout this application may be applied to the various designs. For example, either central or edge delivery designs may be utilized with different embodiments of the assemblies described.

Figure 4:
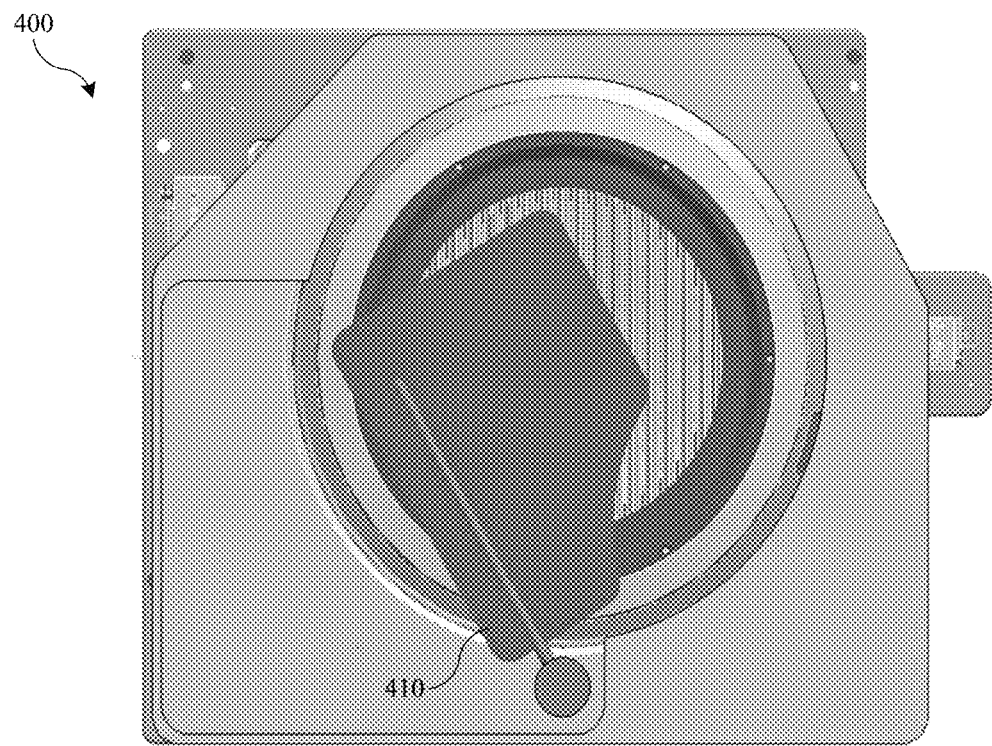
FIG. 4 shows a schematic top plan view of a rinsing assembly according to some embodiments of the present technology.

FIG. 4 shows a schematic top plan view of a rinsing assembly 400 according to some embodiments of the present technology. Rinsing assembly 400 may include a splash guard 410 characterized by larger lateral profile than splash guard 330 described above. Splash guard 410 may be characterized by an arcuate surface along a leading edge to ensure access to the plating bath vessel is not blocked or impacted during plating. Depending on the shape of associated housing, splash guard 410 may be characterized by any shape to accommodate increased area to further limit splashing on the wafer, or flow of rinse fluid into the plating bath vessel.

Figure 5:
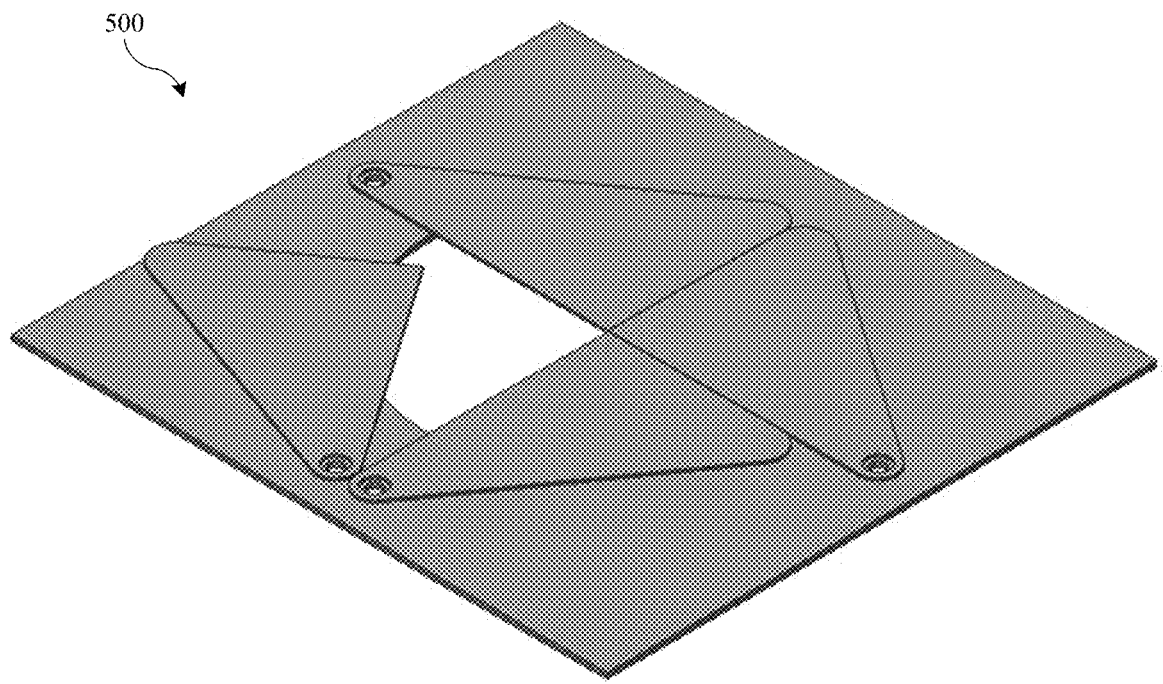
FIG. 5 shows a schematic exemplary splash guard according to some embodiments of the present technology.

FIG. 5 shows a schematic exemplary splash guard 500 according to some embodiments of the present technology. Splash guard 500 illustrates one of a variety of embodiments in which the splash guard may include multiple components operating in tandem to reduce exposure of an access to the plating bath vessel. Although four components are illustrated, two, three, four, up to any number of components may be included to accommodate the shape and size of the access. In some embodiments the components may be individually controlled, while in other embodiments linkages or connections may be made about the rim of an associated frame to couple the movements of multiple components together. Such a design may reduce the complexity or number of motorized items within an assembly. By utilizing multiple components, a reduced footprint at a single lateral position for a housing may be provided, while also providing increased coverage over the plating bath vessel. For example, embodiments according to the present technology may provide greater than or about 50% coverage of the access to the plating bath vessel, and may provide greater than or about 60% coverage of the access, greater than or about 70% coverage of the access, greater than or about 80% coverage of the access, greater than or about 90% coverage of the access, or embodiments of the present technology may provide complete or substantially complete coverage of the access.

Figure 6A:
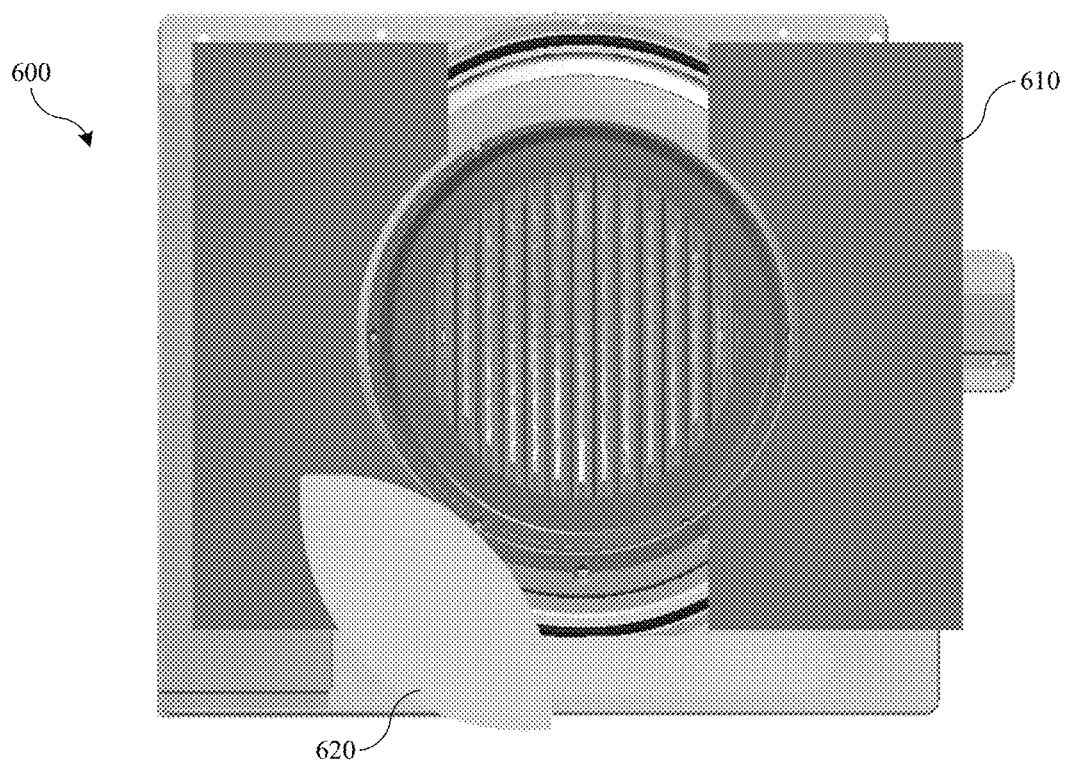
FIGS. 6A-6B show schematic top plan views of a rinsing assembly according to some embodiments of the present technology.
Figure 6B:
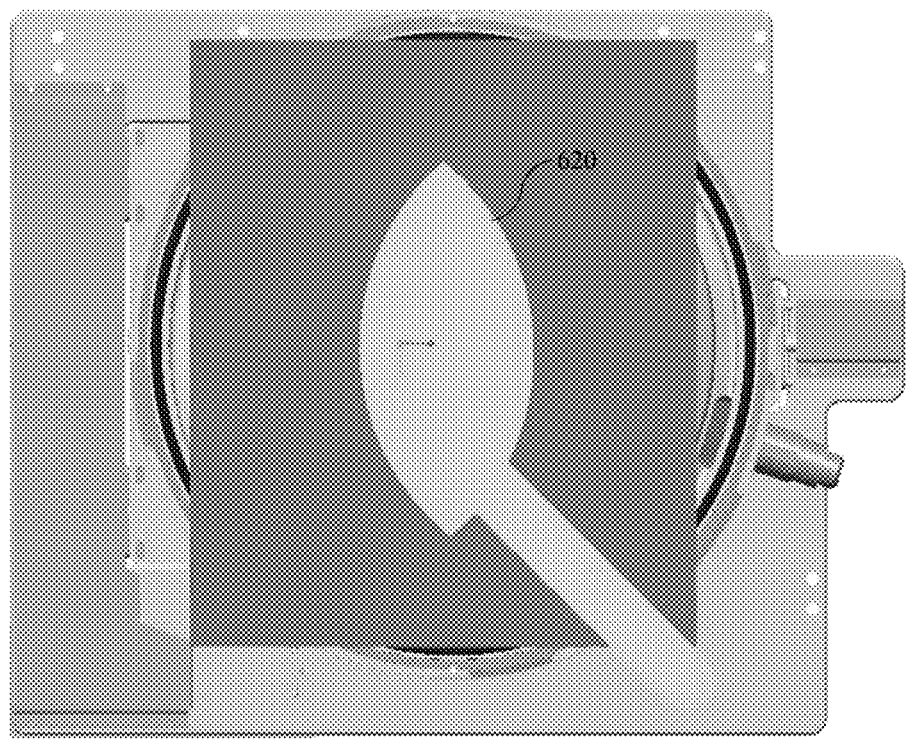

FIGS. 6A-6B show schematic top plan views of a rinsing assembly 600 according to some embodiments of the present technology. Rinsing assembly 600 may include a two-component splash guard 610, as well as a platform 620 that may pivot over a gap formed by the two splash guard components 610. The splash guard components may be characterized by an arcuate profile along a portion of a leading edge of the component to limit overhang into the access during plating operations. Although in some embodiments the two components may be sized to overlap in the middle to provide complete coverage, such a design may increase outward extension of a trailing edge of the components when in the recessed position. Additionally, platform 620 may also accommodate a central positioning of a fluid nozzle as described previously.

Figure 7A:
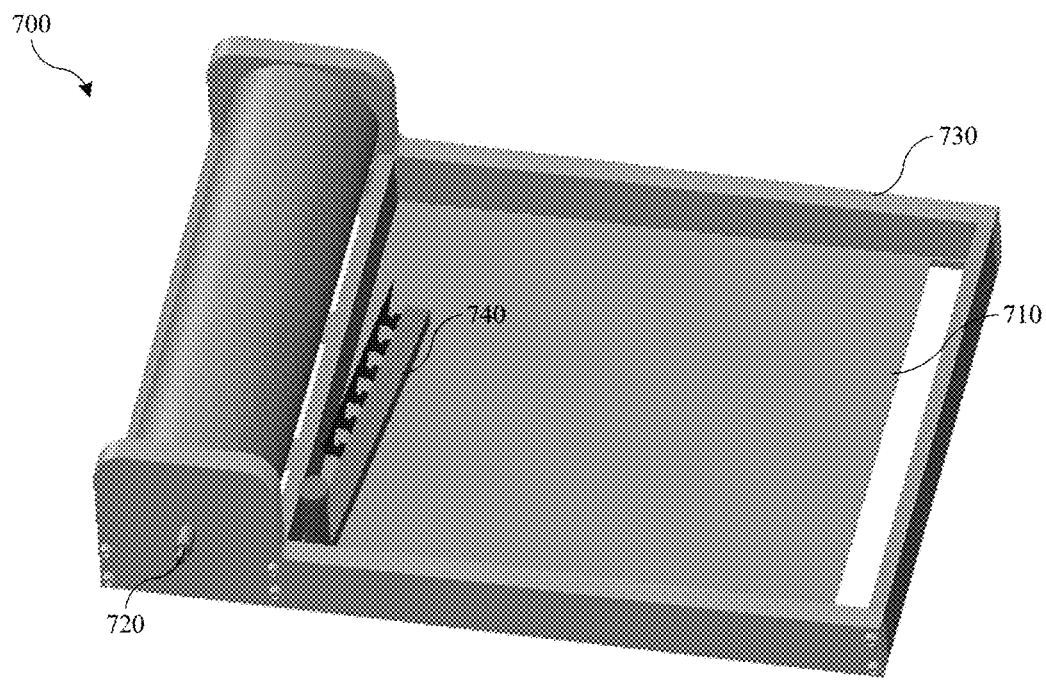
FIGS. 7A-7B show schematic perspective views of a rinsing assembly according to some embodiments of the present technology.
Figure 7B:
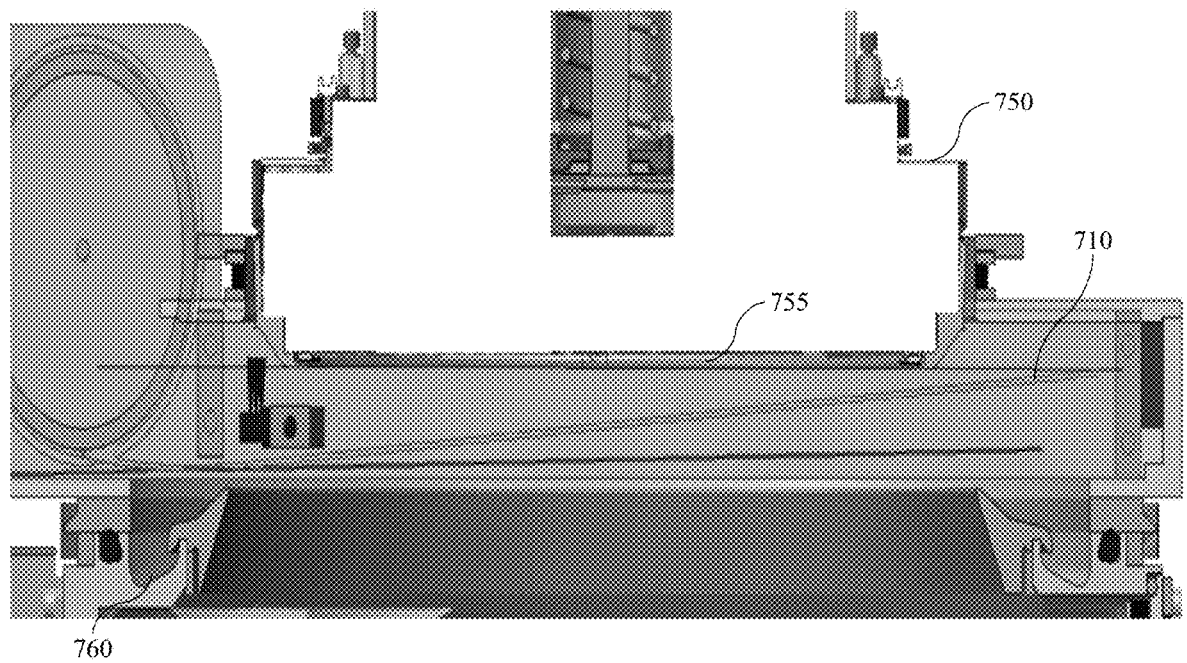

FIGS. 7A-7B show schematic perspective views of a rinsing assembly 700 according to some embodiments of the present technology. Rinsing assembly 700 may include a retractable floor 710, which may be extended across the plating bath vessel by actuating a roller 720. In some embodiments a frame 730 may be used that includes guides or tracks to ensure proper extension of the floor material. A set or bank of rinsing nozzles 740 may be coupled with the floor, and may pivot from a retracted position adjacent roller 720 to an operational position allowing contact with the substrate across the surface on which plating may have been performed. Additionally, as illustrated in FIG. 7B, floor 710 may be characterized by a slope extending upward towards the head 750 on which wafer 755 may be coupled. Fluid used during the rinsing may flow back toward the roller, where it may be collected in a rinsing channel 760. For example, apertures or slots may be formed at a position of the floor material overlying the rinsing channel when the floor is in an extended position. Additional sloping may also occur to direct the fluid to additional or alternative locations away from a plating bath vessel. In some embodiments head 750 may also be tilted towards or away from the sloped flooring or the nozzle bank to accommodate rinsing. Any other embodiment described elsewhere may similarly include tilting the head to facilitate rinsing.

Figure 8:
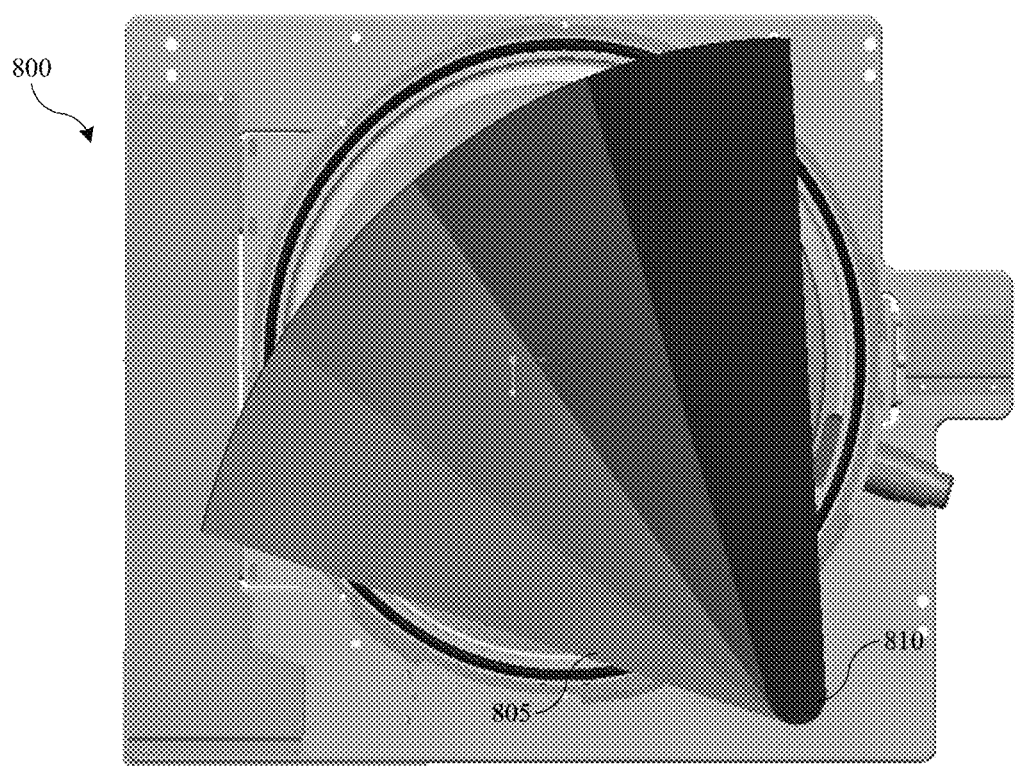
FIG. 8 shows a schematic top plan view of a rinsing assembly according to some embodiments of the present technology.

FIG. 8 shows a schematic top plan view of a rinsing assembly 800 according to some embodiments of the present technology. As illustrated a splash guard 805 of overlapping components may be extended across the access overlying the plating bath vessel. The components may include any number of components that may be retracted together from a common coupling 810. The number of components may be selected based on a width available in a recessed position, as well as an overall height of the stacked components in the recessed position. The splash guard 805 as well as any of the components may be sloped in one of more directions to direct rinse fluid away from the plating bath vessel. For example, the splash guard 805 may be sloped to directed rinse fluid towards a drain located proximate coupling 810. The slope may also be directed elsewhere, including to a channel located within the rim as previously described. Additionally, one or more of the trailing edges of one of the components may include or be formed of a flexible material in direct contact with an underlying component. During retraction, the material may operate to sweep residual rinse fluid from the underlying component, and may operate similar to a squeegee. A similar material may be incorporated at leading edges of the underlying components in some embodiments to sweep any splashed plating bath solution from an overlying component during retraction.

Figure 9:
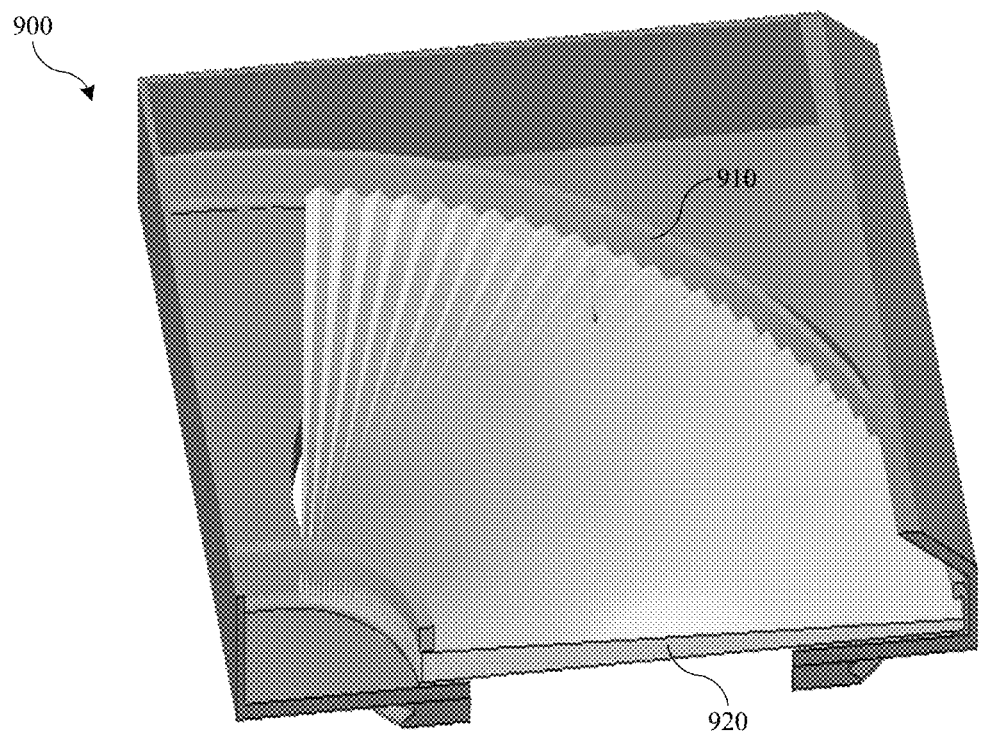
FIG. 9 shows a schematic top plan view of a rinsing assembly according to some embodiments of the present technology.

FIG. 9 shows a schematic top plan view of a rinsing assembly 900 according to some embodiments of the present technology. Assembly 900 may include a track 910 configured to guide a retractable flooring 920 having a folded or accordion profile. The flooring 920 may be sloped to direct rinse fluid to a particular location, such as through the track, flooring, or some other location to direct the fluid away from the plating bath.

Figure 10:
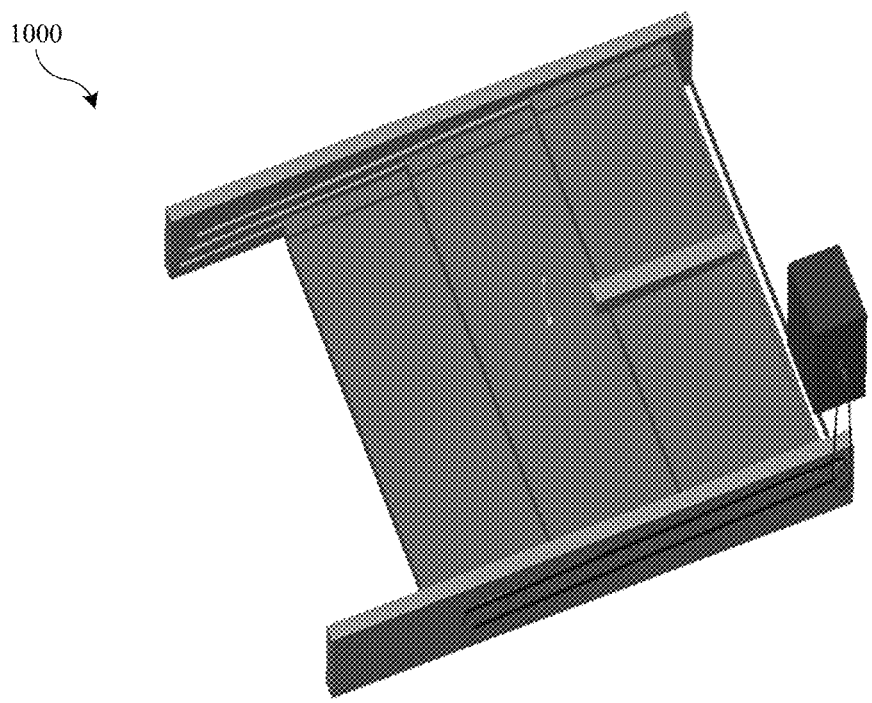
FIG. 10 shows a schematic plan view of a rinsing assembly according to some embodiments of the present technology.
Figure 11:
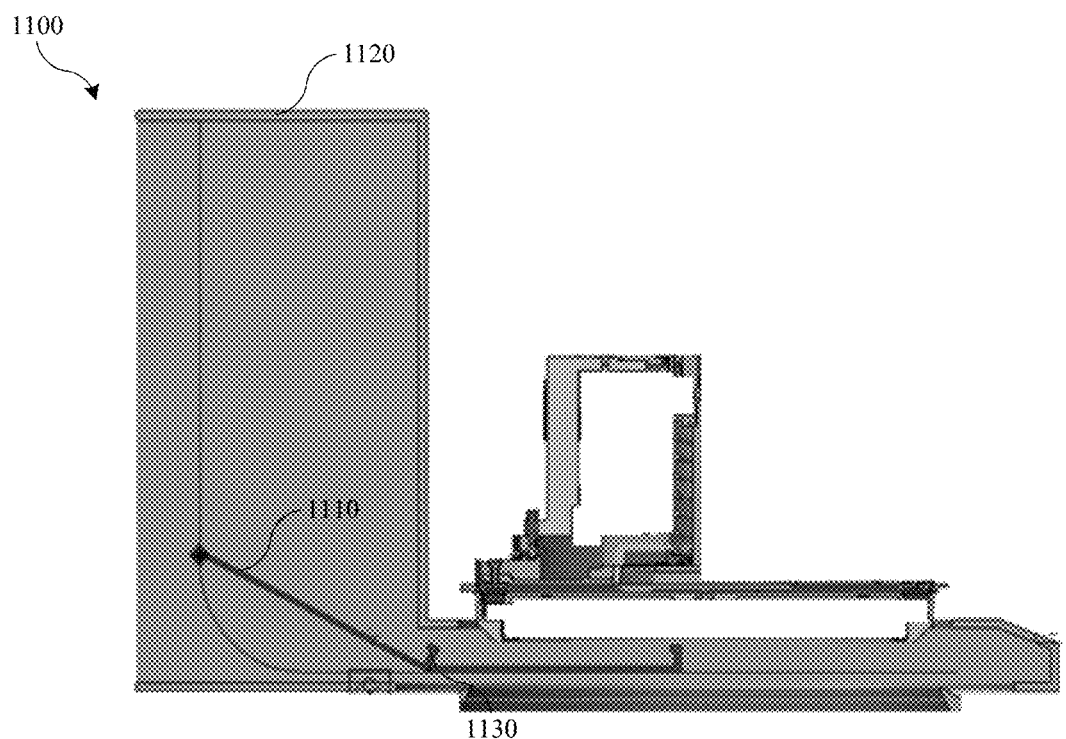
FIG. 11 shows a schematic top plan view of a rinsing assembly according to some embodiments of the present technology.

FIG. 10 shows a schematic plan view of a rinsing assembly 1000 according to some embodiments of the present technology. FIG. 10 may illustrate an additional variation of overlying components, which may be extended or retracted over a bath access. The figure may be a top or bottom view of the assembly depending on orientation during retraction or intended flow of residual rinse fluid which may contact the splash guard. FIG. 11 shows a schematic top plan view of a rinsing assembly 1100 according to some embodiments of the present technology. Depending on the flooring 1110 to be used, extended vertical housing 1120 may be included to accommodate the flooring in a recessed position. Flooring 1110 may include any number of planks with a coupling 1130 between each plank. The coupling 1130 may be flexible, or may be a joint between two adjacent planks.

Figure 12A:
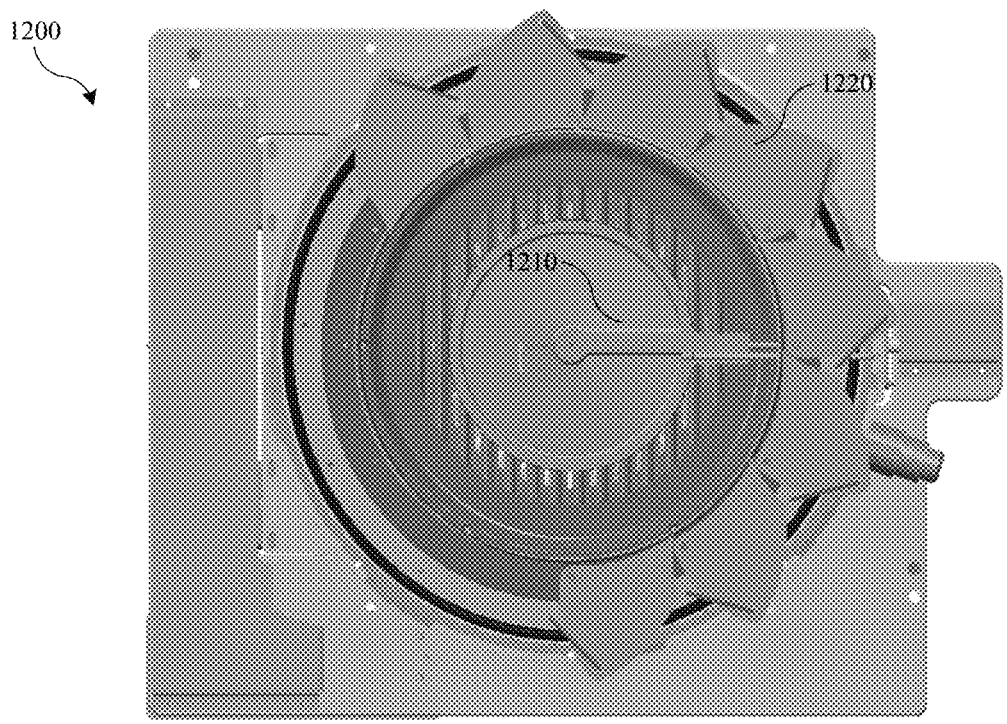
FIGS. 12A-12B show schematic perspective views of a rinsing assembly according to some embodiments of the present technology.
Figure 12B:
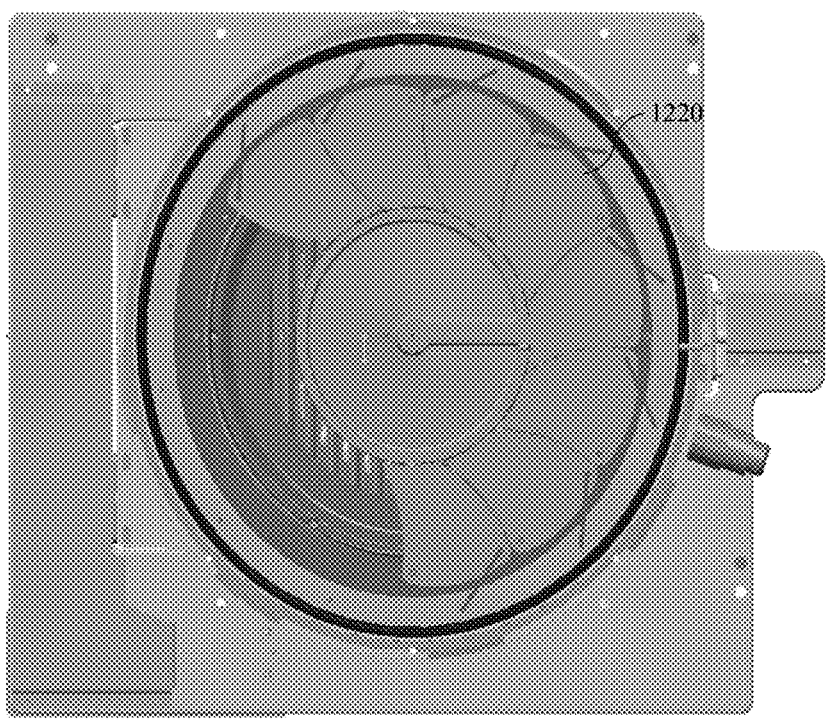
Figure 13A:
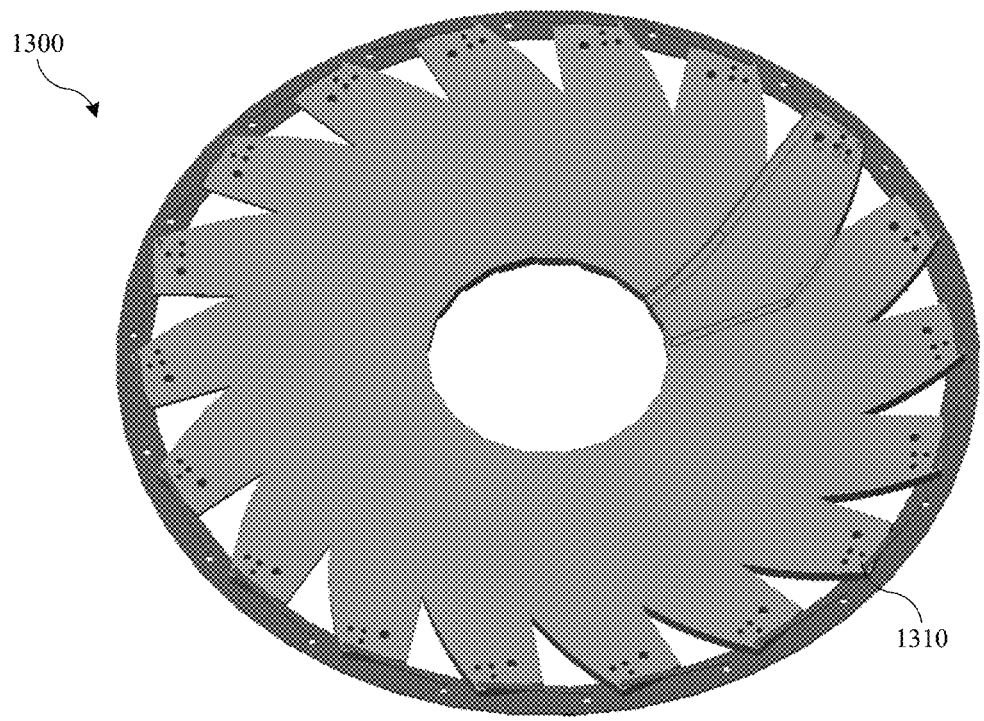
FIGS. 13A-13B show schematic perspective views of a rinsing assembly according to some embodiments of the present technology.
Figure 13B:
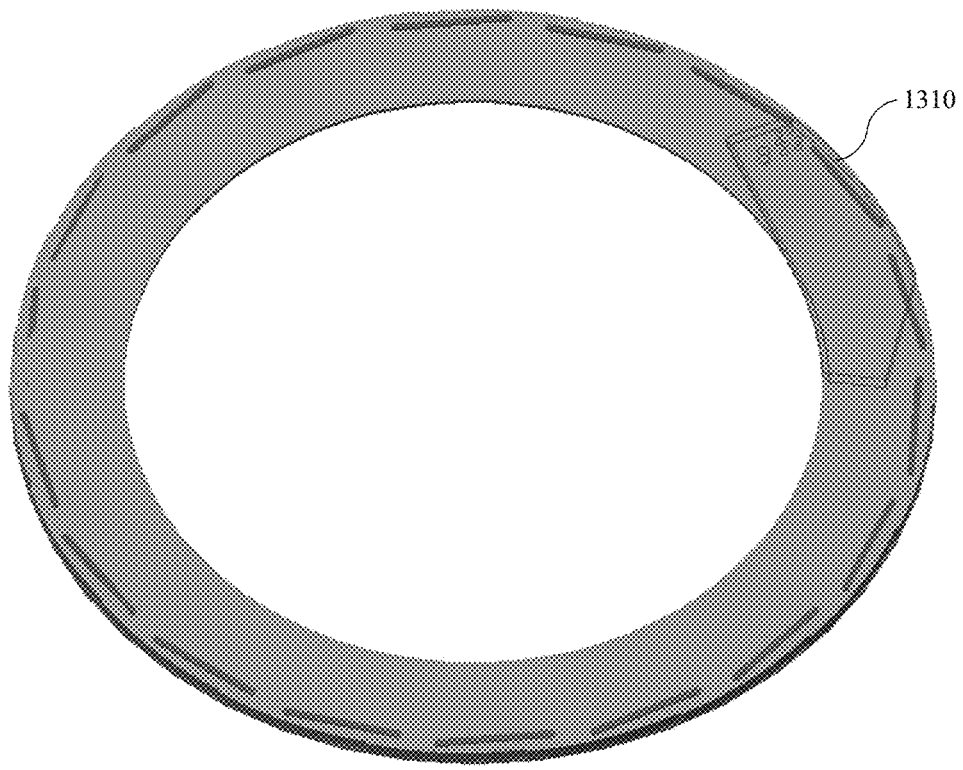

FIGS. 12A-12B show schematic perspective views of a rinsing assembly 1200 according to some embodiments of the present technology. Assembly 1200 may include multiple components configured to cover an access to the plating bath vessel. For example, a splash guard 1210 may include a similar platform as previously described. The assembly may additionally include edge components 1220 coupled together with linkages and configured to be rotated into position during a rinsing operation. As shown in FIG. 12B, the edge components ensure coverage of a region radially outward of the splash guard platform. For example, in systems where a housing accommodating the platform is limited in area, additional components as illustrated may overcome the limited platform size to provide substantial or complete coverage of the access. The edge components 1220 may slightly overlap the platform, and may be sloped towards the platform in some embodiments to facilitate retrieval of residual rinse fluid, such as with an aspirator as previously described. FIGS. 13A-13B show schematic perspective views of a rinsing assembly 1300 according to some embodiments of the present technology. Assembly 1300 may be similar to assembly 1200, although the edge components may be configured to further extend across the access, such as with even further reduced platform sizing. When retracted, as illustrated in FIG. 13B, the edge components 1310 may be fully recessed within the rim to limit impact on the access during plating operations.

Figure 14:
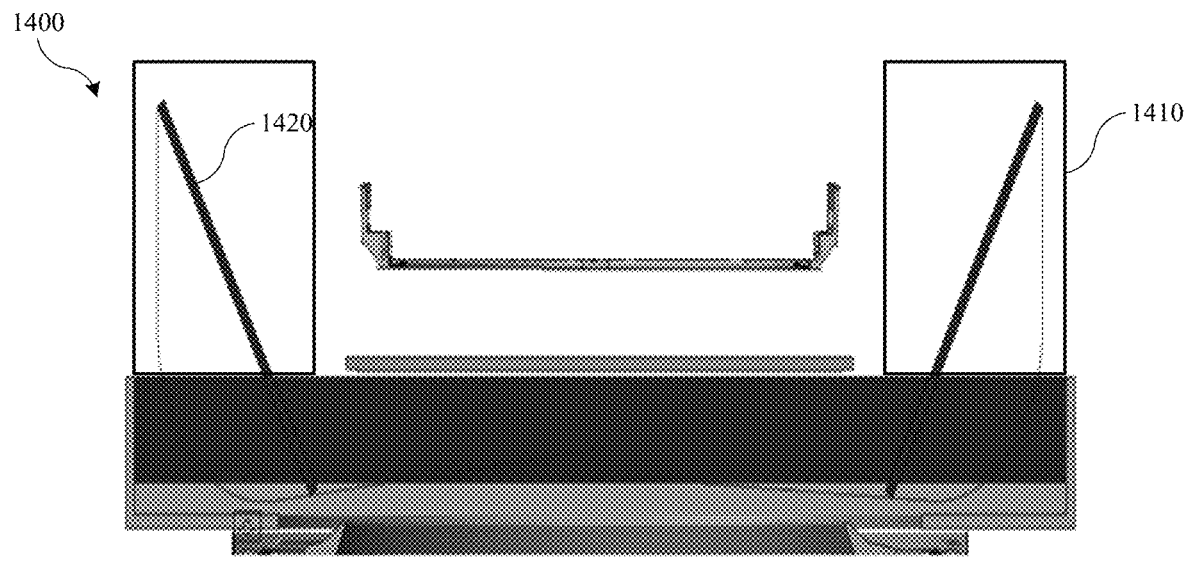
FIG. 14 shows a schematic top plan view of a rinsing assembly according to some embodiments of the present technology.

FIG. 14 shows a schematic top plan view of a rinsing assembly according to some embodiments of the present technology. Assembly 1400 may be similar to assembly 1100 described above. Assembly 1400 may include multiple housings 1410 to reduce the height required to fully retract the flooring 1420. One or more flooring panels may extend from either side or housing and may connect or overlap at a central location to limit exposure of the plating bath vessel.

Figure 15:
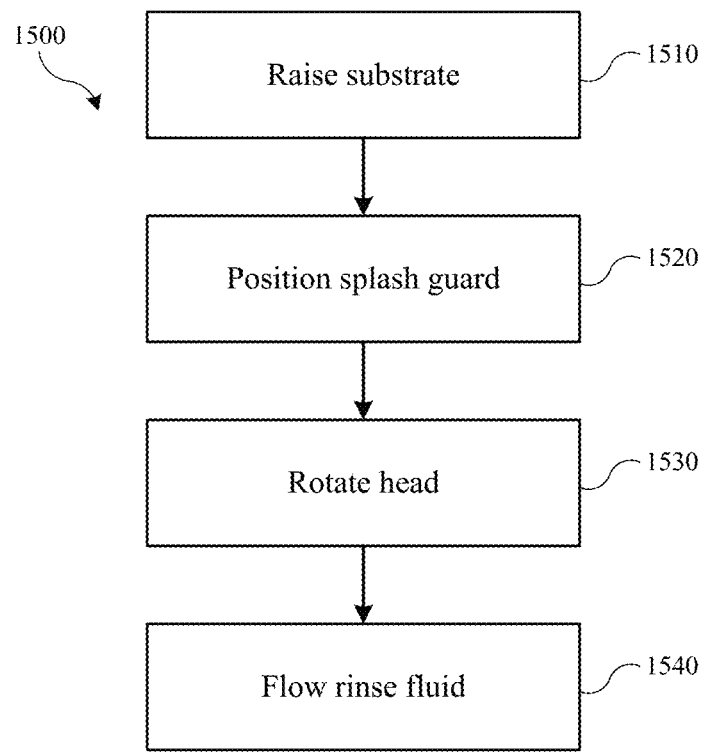
FIG. 15 shows exemplary operations in a method of rinsing a substrate at a semiconductor plating chamber according to some embodiments of the present technology.

The systems and components previously described may be used in a number of methods for in situ component cleaning. FIG. 15 shows operations of an exemplary method 1500 of rinsing a substrate at a semiconductor plating chamber according to some embodiments of the present technology, and which may use any of the components previously described. Method 1500 may include operations prior to the actual substrate cleaning. For example, prior to the cleaning, a system head may deliver a substrate into a plating bath vessel to perform an electroplating operation. The head may be raised at operation 1510 from the plating bath. As previously described, the head may include a seal and the substrate may be clamped or coupled with the seal.

A splash guard may be positioned between the plating bath and substrate at operation 1520. The splash guard may include positioning flooring, a platform, and/or one or more fluid nozzles associated with the splash guard. The head may be rotated at operation 1530, which as previously described may facilitate slinging rinse fluid to a collection channel external to the plating bath vessel, and which may be defined by a rinse frame extending above and radially outward of the plating bath. At operation 1540, a rinse fluid may be flowed across the substrate from a fluid nozzle, and then directed by the inertia of the rotating head and slung from a radial edge of the substrate into the collection channel. The fluid nozzle may be coupled with the splash guard in some embodiments, and may be positioned proximate a central location below the substrate during the positioning of the splash guard.

Before, during, or after the substrate cleaning, a seal cleaning operation may be performed. For example, the system may include a seal clean nozzle coupled with the rinse frame. The seal clean nozzle may be positioned and operated to direct the rinse fluid tangentially across the seal and into the collection channel. The system may also perform a drying operation utilizing a gas nozzle. The gas nozzle may be coupled adjacent the fluid nozzle, and the methods may also include flowing an inert gas across the substrate to dry residual rinse fluid from a surface of the substrate. By utilizing the present technology, improved rinsing operations may be performed. By protecting both the substrate from the plating bath, and the plating bath from rinse fluid, dilution and contamination issues discussed previously may be limited, and in some embodiments prevented. Additionally, improved delivery of rinse fluid may more completely clean substrates.

As previously described, over time plating up on the seal may occur, which can cause issues with complete plating on the substrate, and may require extensive cleaning of the components after a certain number of operations. For example, in some cases, the seals may be taken or shipped to an off-site location where they may be soaked in a heated caustic solution for extended periods of time while ultrasonic energy is applied to promote the removal of plate-up species and precursors. These extra operations may be costly in regards to available tool time as well as monetary cost.

Conventional cleaning schemes have focused on chemistries or physical mechanisms targeted at removing metals and metal ions on the polymer seal surface. Often, the material to be cleaned is invisible to the naked eye. However, testing has shown that even daily wipe down with 20% nitric acid may increase the time between plate-up occurrences significantly, such as from doubling the time to increasing the time to plate-up by over tenfold. Plate-up will still occur, though, and observation in some instances illustrates that material may be collecting on seal surfaces that may not be cleaned adequately in a daily operation, indicating the need for an improved cleaning process to prevent seal plate-up.

Often a discoloration may gradually form on the plating seals. Experiments have shown this discoloration may be due to the gradual build-up of organic based deposits on the seal. The source of the organic material may be from photoresist or solvents from the wafers being processed. More likely, the build-up may be from the deposition of organic compounds which are a part of the plating bath. These would include the family of organic additives such as accelerators, levelers, and suppressors in copper plating baths and chelating agents and complexing agents in tin silver baths. Due to the characteristics of these organic compounds, which are specifically designed to bond with and interact with metal ions in solution, as they plate onto what should be electrically neutral polymer surfaces such as the seals in the plating chamber, they may be accompanied by metals, which are conductive and may alter the surface of the polymer seal to have some degree of conductivity not previously present. The result may be that these plated materials will create conductive paths or shorten the conductive path to the electrically charged contacts and provide a source of electrons to the insulating surface resulting, eventually, in plate-up. In some instances, plate-up has been observed to have occurred specifically on top of observed organic filaments. This may indicate that the organic material may be acting as an adhesion layer or precursor which eventually allows or creates the conductive path from the contacts or charge tunneling site through the seal to the seal surface, resulting in plate-up. Thus, while the removal of metals and metallic ions from the surface is desirable, such operations may not be addressing the underlying problem related to the organics.

While strong caustics are known to be effective at removing organic materials, such removal may be accomplished only over extended time and at elevated temperature. While such a procedure may be accomplished with success, it may be difficult to include such a procedure on-board of a plating tool and may in some instances be relegated to off-board implementation. The present technology may also implement a clean specifically targeting the removal of the organic deposits. The removal of the organic matrix may be accompanied by the removal of metals and metal ions within the matrix. While an acidic clean may be effective at denuding the surface of the organic deposit of metals, the bulk matrix may still incorporate metals which may form a foundation for ready replenishment of contaminating species on the next pass through the plating bath. Removal of the organics, accompanied by the removal of included metals, may revert the polymer material back to an original state, which may be smooth and metal free, and may eliminate or extend the time for initiation of plate-up for numerous additional cycles. Periodic cleaning of the seal surface to remove organics may therefore be a preferred method for preventing plate-up.

A variety of organic solvents may remove organic build-up from seals. Some of the chemicals which have been used successfully include: toluene, acetone, di-methyl sulfoxide (DMSO), N-methyl 2-pyrrolidone (NMP), methyl sulfonic acid (MSA), as well as commercial photoresist removal chemistries such as EKC 265, Techic NF-52, and Shipley BPR. Such commercial strippers may be blends of organic solvents which may include NMP, DMSO, tetra-methyl ammonium hydroxide (TMAH), ethylene glycol (EG), or other such solvents. In virtually all cases, the efficacy of the solvent may be improved when accompanied by some degree of mechanical force to effectively remove thick organic deposits from seal surfaces, which may be deposited after many hundreds of plating cycles and may be over a hundred microns thick. However, where such deposits are from a few tens of cycles, such mechanical force may be optional and the solvating capability of the solvent alone may effectively remove the deposits and maintain the relatively clean state of the seal, although continued intervals of cleaning may be performed to maintain the clean surface.

Accordingly, processes as previously described may further include application of any of the above-listed materials at intermittent intervals between plating or rinsing operations. The materials may be applied from either a fluid nozzle or a seal-clean nozzle, and operations may also include mechanical application, such as a wipe down with a cloth or pad on an applicator applied manually or by the tool, or the application of sonic energy. An additional arm may be attached to the frame or to a separate module at which the chemical rinse may be performed. In some embodiments a substrate may be removed from the seal prior to cleaning operations. Heating of either the solvent or the seal may also be performed during cleaning operations, and the heating may occur with the chemical baths or by the application of heat, such as from IR lamps.

In the preceding description, for the purposes of explanation, numerous details have been set forth in order to provide an understanding of various embodiments of the present technology. It will be apparent to one skilled in the art, however, that certain embodiments may be practiced without some of these details, or with additional details. For example, other substrates that may benefit from the wetting techniques described may also be used with the present technology.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the channel" includes reference to one or more channels and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. An electroplating apparatus comprising:
    a plating bath vessel;
    a head configured to support a substrate;
    a rinsing frame extending above the plating bath vessel and defining a central aperture through which the head extends into the rinsing frame to access the plating bath vessel, the rinsing frame comprising:
        a rim coupled with and extending circumferentially above an upper surface of the plating bath vessel and defining a rinsing channel between the rim and the upper surface of the plating bath vessel; and
    a rinsing assembly comprising:
        a splash guard translatable from a recessed first position to a second position between the rim of the rinsing frame and the plating bath vessel, and
        a fluid nozzle coupled with the splash guard, wherein when the splash guard is in the second position, a central axis of the fluid nozzle is positioned below and aligned with a central axis of the head.

2. The electroplating apparatus of claim 1, wherein the head is rotatable, wherein the fluid nozzle is indirectly coupled with the rinsing frame, and wherein when the splash guard is in the second position, the fluid nozzle is positioned within 10 mm from a center of the head.

3. The electroplating apparatus of claim 2, wherein the head is configured to rotate during rinsing at a velocity configured to sling fluid delivered from the fluid nozzle from a radial edge of a supported substrate into the rinsing channel.

4. The electroplating apparatus of claim 2, wherein the head comprises a seal about the head, wherein the electroplating apparatus further comprises a seal clean nozzle coupled with the rim, and wherein the seal clean nozzle is configured to eject a fluid tangentially across an exterior radial edge of the seal and into the rinsing channel.

5. The electroplating apparatus of claim 1, wherein the splash guard comprises a sloped or concave surface.

6. The electroplating apparatus of claim 1, wherein the fluid nozzle is a first fluid nozzle, the electroplating apparatus further comprising a second fluid nozzle adjacent the first fluid nozzle and configured to deliver inert gas to a surface of a substrate.

7. The electroplating apparatus of claim 1, wherein the rinsing assembly further comprises a second fluid nozzle positioned in line with and radially outward of the central axis from the fluid nozzle.

8. The electroplating apparatus of claim 1, further comprising an aspirator coupled with the splash guard.

9. The electroplating apparatus of claim 1, wherein the splash guard comprises a plurality of components coupled about the rim with a linkage, and wherein when the splash guard is in the second position, the plurality of components are configured to cover greater than 80% of the access to the plating bath vessel.

10. The electroplating apparatus of claim 1, wherein the splash guard comprises a floor extendable across the plating bath vessel.

11. The electroplating apparatus of claim 10, wherein the floor is characterized by a slope when extended across the plating bath vessel.

12. The electroplating apparatus of claim 10, wherein the floor comprises multiple retractable components.

13. The electroplating apparatus of claim 12, wherein at least one of the multiple retractable components comprises a flexible edge material configured to sweep residual fluid from an adjacent retractable component during a retraction operation of the floor.

14. The electroplating apparatus of claim 10, wherein the rinsing frame further comprises a track configured to guide the floor across the plating bath vessel.

15. A method of rinsing a substrate at a semiconductor plating chamber, the method comprising:
    raising a head from a plating bath, the head comprising a seal and a substrate coupled with the seal, wherein a rinsing frame extends above the plating bath and defines a central aperture through which the head extends into the rinsing frame to access the plating bath, the rinsing frame comprising:
        a rim coupled with and extending circumferentially above an upper surface of the plating bath and defining a rinsing channel between the rim and the upper surface of the plating bath; and
    a rinsing assembly comprising:
        a splash guard translatable from a recessed first position to a second position between the rim of the rinsing frame and the plating bath;
        a fluid nozzle coupled with the splash guard, wherein when the splash guard is in the second position, a central axis of the fluid nozzle is positioned below and aligned with a central axis of the head; and
    positioning the splash guard between the plating bath and the substrate;
    rotating the head; and
    flowing a rinse fluid across the substrate from the fluid nozzle, wherein rotating the head slings the rinse fluid from a radial edge of the substrate to a collection channel defined by the rinse frame extending above and radially outward of the plating bath.

16. The method of rinsing a substrate at a semiconductor plating chamber of claim 15, wherein a seal clean nozzle is coupled with the rinse frame, the method further comprising:
    flowing the rinse fluid from the seal clean nozzle, wherein the seal clean nozzle is positioned to direct the rinse fluid tangentially across the seal and into the collection channel.

17. The method of rinsing a substrate at a semiconductor plating chamber of claim 15, wherein the fluid nozzle is coupled with the splash guard, and wherein the fluid nozzle is positioned proximate a central location below the substrate during the positioning of the splash guard.

18. The method of rinsing a substrate at a semiconductor plating chamber of claim 15, wherein a gas nozzle is coupled adjacent the fluid nozzle, the method further comprising:
    flowing an inert gas across the substrate to dry residual rinse fluid from a surface of the substrate.

19. An electroplating apparatus comprising:
a plating bath vessel;
a head comprising a seal configured to support a substrate;
a rinsing frame extending above the plating bath vessel, the rinsing frame comprising:
- a rim extending circumferentially above an upper surface of the plating bath vessel and defining a rinsing channel between the rim and the upper surface of the plating bath vessel, and
- a housing extending laterally from the rim; and a rinsing assembly comprising:
- a splash guard translatable from a first position recessed within the housing to a second position between the rim of the rinsing frame and the plating bath vessel and located between the plating bath vessel and the head, and
- a fluid nozzle coupled with the splash guard, the fluid nozzle extending from the housing along the splash guard, wherein when the splash guard is in the second position, a central axis of the fluid nozzle is positioned below and aligned with a central axis of the head.

20. The electroplating apparatus of claim 19, wherein the splash guard is characterized by a sloped or curved profile extending from an edge towards a central location proximate the fluid nozzle, and wherein the rinsing assembly further comprises:
- a drying nozzle positioned adjacent the fluid nozzle and configured to deliver a gas to dry a substrate subsequent rinsing, and
- an aspirator positioned proximate the fluid nozzle and configured to retrieve fluid disposed on the splash guard.

* * * * *